(12) United States Patent
Shimura et al.

(10) Patent No.: US 8,094,835 B2
(45) Date of Patent: Jan. 10, 2012

(54) SIGNAL PROCESSING APPARATUS

(75) Inventors: Masaru Shimura, Kanagawa (JP); Taro Nakagami, Tokyo (JP); Kazunobu Ohkuri, Kanagawa (JP)

(73) Assignee: Sony Corporation, Tokyo (JP)

( * ) Notice: Subject to any disclaimer, the term of this patent is extended or adjusted under 35 U.S.C. 154(b) by 1128 days.

(21) Appl. No.: 11/903,568

(22) Filed: Sep. 24, 2007

(65) Prior Publication Data

US 2008/0170719 A1    Jul. 17, 2008

(30) Foreign Application Priority Data

Sep. 26, 2006   (JP) .................................. 2006-259919

(51) Int. Cl.
  *H04B 15/00*   (2006.01)
(52) U.S. Cl. ........................ 381/94.1; 381/61; 381/101
(58) Field of Classification Search .................. 381/94.1, 381/61, 101
See application file for complete search history.

(56) References Cited

U.S. PATENT DOCUMENTS

| | | | | |
|---|---|---|---|---|
| 3,767,833 | A * | 10/1973 | Noble et al. ..................... | 84/673 |
| 6,792,115 | B1 * | 9/2004 | Vierthaler ......................... | 381/61 |
| 7,394,908 | B2 * | 7/2008 | Katou et al. ..................... | 381/98 |
| 7,592,941 | B2 * | 9/2009 | Ohkuri et al. .................. | 341/155 |
| 7,876,252 | B1 * | 1/2011 | Wegener ......................... | 341/155 |
| 8,005,233 | B2 * | 8/2011 | Smith ............................. | 381/61 |
| 2004/0071297 | A1 * | 4/2004 | Katou et al. ..................... | 381/61 |
| 2005/0013446 | A1 * | 1/2005 | Aarts ............................... | 381/61 |
| 2005/0141727 | A1 * | 6/2005 | Vierthaler ......................... | 381/61 |
| 2005/0265561 | A1 * | 12/2005 | Manish et al. .................. | 381/61 |
| 2006/0159283 | A1 * | 7/2006 | Mathew et al. .................. | 381/98 |
| 2008/0103763 | A1 * | 5/2008 | Shimura et al. ............. | 704/200.1 |
| 2008/0170719 | A1 * | 7/2008 | Shimura et al. ............... | 381/94.1 |
| 2008/0186218 | A1 * | 8/2008 | Ohkuri et al. .................. | 341/143 |
| 2008/0212791 | A1 * | 9/2008 | Asada et al. .................. | 381/71.6 |
| 2009/0052695 | A1 * | 2/2009 | Yamada et al. ............... | 381/101 |
| 2010/0318205 | A1 * | 12/2010 | Ohkuri et al. .................. | 700/94 |

FOREIGN PATENT DOCUMENTS

| | | |
|---|---|---|
| JP | 08-213862 | 8/1996 |
| JP | 3658412 A | 8/1996 |
| JP | 2004-320516 A | 11/2004 |

* cited by examiner

*Primary Examiner* — Laura Menz
(74) *Attorney, Agent, or Firm* — Wolf, Greenfield & Sacks, P.C.

(57) ABSTRACT

A signal processing apparatus includes first and second extracting units extracting frequency components having a first frequency band and a second frequency band, respectively, from an input audio signal, a first-harmonic-component generating unit generating a first-harmonic-component signal including a frequency component whose frequency is N1 times that of the frequency component extracted in the first extracting unit, a second-harmonic-component generating unit generating a second-harmonic-component signal including a frequency component whose frequency is N2 times that of the frequency component extracted in the second extracting unit, and a combining unit combining the input audio signal, and the first- and the second-harmonic-component signals in a predetermined ratio. The first frequency band is higher than the second frequency band. N1 and N2 are positive integers, and N1 is smaller than N2.

8 Claims, 12 Drawing Sheets

FIG. 7
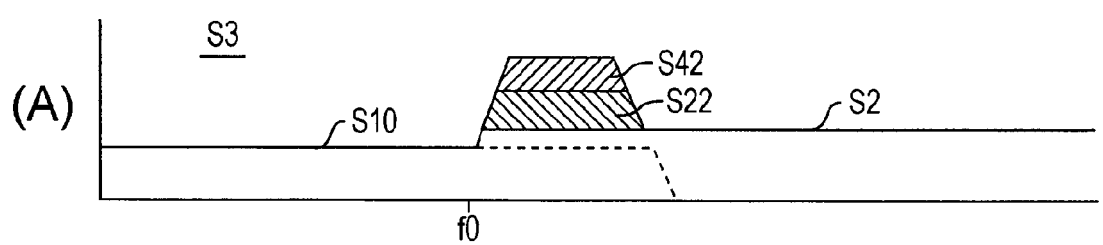
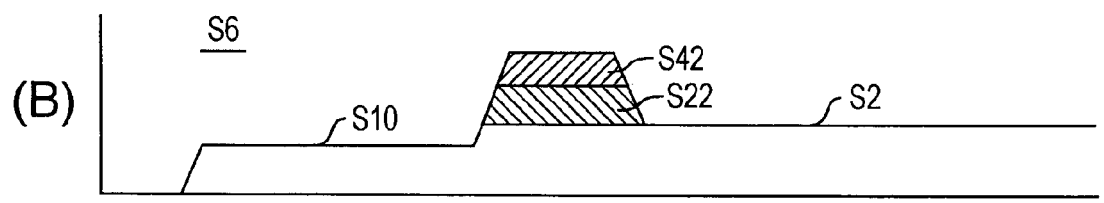

SIGNAL PROCESSING APPARATUS

CROSS REFERENCES TO RELATED APPLICATIONS

The present invention contains subject matter related to Japanese Patent Application JP 2006-259919 filed in the Japanese Patent Office on Sep. 26, 2006, the entire contents of which are incorporated herein by reference.

BACKGROUND OF THE INVENTION

1. Field of the Invention

The present invention relates to a signal processing apparatus, and more particularly, to an audio reproducing apparatus.

2. Description of the Related Art

A so-called minicomponent, a flat-screen television, or the like tends to have a speaker with a small diameter and a speaker box (enclosure) with a small capacity in which the speaker is placed. Accordingly, the resonance frequency f0 of the speaker is about 100 Hz or higher in many cases.

Generally, when an audio signal whose frequency is lower than or equal to the resonance frequency f0 of a speaker is supplied to the speaker, as the frequency of the audio signal increases, the sound pressure of the fundamental frequency component decreases, and the number of frequency components (harmonic components) that cause sound distortion rapidly increases.

Thus, it is difficult for an audio reproducing apparatus in which the above-mentioned speaker having a small diameter is used to sufficiently reproduce bass whose frequency is lower than or equal to the resonance frequency f0 of the speaker.

An instrumental tone includes the fundamental and its harmonics, and the tone color is decided by the ratio between the fundamental and its harmonics. Regarding audibility, even when the fundamental is not output, the output of its harmonics enables a listener to perceive the output sound as if the fundamental were output. This is psychoacoustically verified.

An audio reproducing apparatus allowing a listener to experience bass using such a sensory property has been suggested. FIG. 11 is a flow diagram of an exemplary audio reproducing apparatus using the sensory property. The exemplary audio processing apparatus includes a speaker 5 having a small diameter whose bass is to be experienced by a listener should be improved.

An audio signal S1 is supplied through an input terminal 1 to a high-pass filter 2. As shown in part (A) of FIG. 12, high and midrange frequency components S2 whose frequencies are higher than or equal to the resonance frequency f0 of the speaker 5 are extracted from the audio signal S1 in the high-pass filter 2 and supplied to a combining circuit 3. Additionally, the audio signal S1 is supplied through the input terminal 1 to a band-pass filter 7. As shown in part (B) of FIG. 12, low frequency components S7 whose frequencies are from f0/2 to f0 are extracted from the audio signal S1 in the band-pass filter 7 and supplied to a pitch shifter 8.

The pitch shifter 8 multiplies the frequencies of the low frequency components S7 supplied thereto by two. As shown in part (C) of FIG. 12, harmonic components S8 whose frequencies are from f0 to 2f0 are output from the pitch shifter 8.

The harmonic components S8 are supplied to the combining circuit 3 to be combined with the high and midrange frequency components S2, and the combining circuit 3 outputs an audio signal S3 including the intensified harmonic components S8 of the low frequency components S7, as shown in part (D) of FIG. 12. This audio signal S3 is supplied through a power amplifier 4 to the speaker 5. Accordingly, a sound having the frequency characteristic shown in part (D) of FIG. 12, i.e., a sound of the audio signal S3 including the intensified harmonic components S8 of the low frequency components S7, is output from the speaker 5.

In this case, the speaker 5 does not output the sound of the low frequency components S7 but outputs the sound of the harmonic components S8 whose fundamental frequency components are the low frequency components S7. As described above, this allows the listener to perceive the sound as if the sound of the low frequency components S7 were output. Thus, the listener can experience the bass although the speaker 5 has a small diameter.

It is regarded that in a case where the frequencies of the harmonic components S7 are multiplied by an integer to generate the harmonic components S8, when the frequencies of the low frequency components S8 are about 200 Hz or lower, the sound of the harmonic components S8 does not make the listener feel that there is something wrong with the sound.

Japanese Unexamined Patent Application Publication No. 8-213862 is given as the related art document.

SUMMARY OF THE INVENTION

In the above-described audio reproducing apparatus, depending on the frequencies of the low frequency components S7, the listener may not experience the desirable bass. For example, the reproducing frequency range (frequency characteristic) of the speaker 5 is shown by the curve F5 in part (A) of FIG. 13, and suppose the resonance frequency f0 of the speaker 5 is 100 Hz.

As shown in part (A) of FIG. 13, when the frequency of one of the low frequency components S7 is 60 Hz, the frequency of a corresponding one of the harmonic components S8 is 120 Hz. Because 120 Hz, the frequency of the harmonic component S8, is included in the reproducing frequency range F5 of the speaker 5, as described above, it is possible for the listener to experience the bass of the low frequency component S7 by receiving the sound of the harmonic component S8.

However, as shown in part (B) of FIG. 13, when the frequency of one of the low frequency components S7 is 35 Hz, the frequency of a corresponding one of the harmonic components S8 is 70 Hz. Because 70 Hz, the frequency of the harmonic component S8, is not included in the reproducing frequency range F5 of the speaker 5, it is difficult for the listener to experience the bass of the low frequency component S7 by receiving the sound of the harmonic component S8. On the contrary, since the harmonic component S8 whose frequency is lower than the resonance frequency f0 of the speaker 5 is supplied to the speaker 5, a distorted sound is output from the speaker 5.

Additionally, suppose the resonance frequency f0 of the speaker 5 is 120 Hz, as shown in part (C) of FIG. 13. When the frequency of one of the low frequency components S7 is 110 Hz, the frequency of a corresponding one of the harmonic components S8 is 220 Hz. Because 220 Hz, the frequency of the harmonic component S8, is included in the reproducing frequency range F5 of the speaker 5, the sound of the harmonic component S8 can be output from the speaker 5. However, as described above, the upper limit of the frequency of the harmonic component S8 whose sound does not make the listener feel that there is something wrong with the sound is about 200 Hz. Because 220 Hz, the frequency of the harmonic component S8, exceeds the upper limit, the sound reproduced by the speaker 5 makes the listener feel that there is something wrong with the sound.

It is desirable to overcome the disadvantages described above.

According to an embodiment of the present invention, there is provided a signal processing apparatus including a first extracting unit, a second extracting unit, a first-harmonic-component generating unit, a second-harmonic-component generating unit, and a combining unit. The first extracting unit is configured to extract a frequency component having a first frequency band from an input audio signal. The second extracting unit is configured to extract a frequency component having a second frequency band from the input audio signal. The first-harmonic-component generating unit is configured to generate a first-harmonic-component signal including a frequency component whose frequency is N1 times that of the frequency component extracted in the first extracting unit. The second-harmonic-component generating unit is configured to generate a second-harmonic-component signal including a frequency component whose frequency is N2 times that of the frequency component extracted in the second extracting unit. The combining unit is configured to combine the input audio signal, the first-harmonic-component signal, and the second-harmonic-component signal in a predetermined ratio. The first frequency band is higher than the second frequency band. N1 and N2 are positive integers, and N1 is smaller than N2.

In a signal processing apparatus according to an embodiment of the present invention, when a frequency of a low frequency component of an audio signal is lower than the resonance frequency f0 of a speaker, a sound of a harmonic component of the low frequency component is output from the speaker. This allows a listener to experience the bass of the low frequency component by receiving the sound of the harmonic component. In addition, the frequency of the low frequency component is multiplied such that the frequency of the low frequency component can fall within a band between the resonance frequency f0 of the speaker and an upper limit frequency f1. This prevents the listener from feeling that there is something wrong with the bass.

BRIEF DESCRIPTION OF THE DRAWINGS

FIG. 7 includes diagrams each showing a frequency characteristic of the signal processing apparatus according to the third embodiment of the present invention;

DESCRIPTION OF THE PREFERRED EMBODIMENTS

First Embodiment

Figure 1:
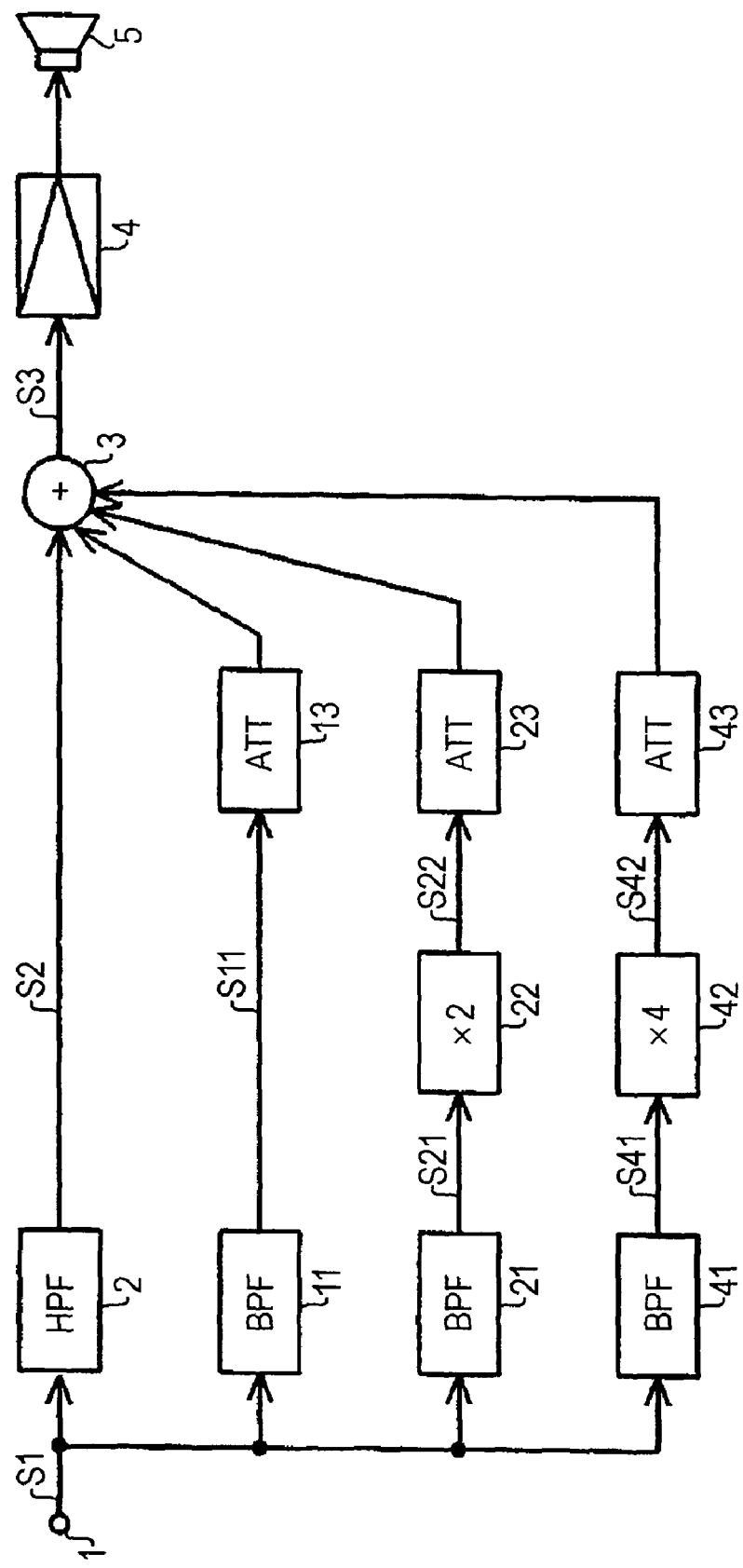
FIG. 1 is a flow diagram of a signal processing apparatus according to a first embodiment of the present invention.

FIG. 1 is a diagram of an exemplary configuration of a signal processing apparatus, which is an audio processing apparatus, according to a first embodiment of the present invention. The signal processing apparatus includes a speaker 5 having a small diameter whose bass is to be experienced by a listener should be improved. Here, f0 and f1 are defined as follows:

f0: the resonance frequency of the speaker 5, which is about 100 Hz or lower in the first embodiment; and f1: the frequency of a frequency component generated by multiplying the frequency of the fundamental frequency component included in a certain signal by an integer, which produces a sound that does not make the listener feel that there is something wrong with the sound, the frequency being typically about 200 Hz.

In the first embodiment, $f0=f1/2$ (or $f0 \leq f1/2$). When the signal processing apparatus is a two-channel stereo apparatus or a multichannel stereo apparatus, each channel of the two-channel stereo apparatus or the multichannel stereo apparatus may have the configuration shown in FIG. 1.

An audio signal S1 is supplied through an input terminal 1 to a high-pass filter 2. As shown by the solid line in part (A) of FIG. 2, high and midrange frequency components S2 whose frequencies are higher than or equal to the resonance frequency f0 of the speaker 5 are extracted from the audio signal S1 in the high-pass filter 2 and supplied to a combining circuit 3. Additionally, the audio signal S1 is supplied through the input terminal 1 to a band-pass filter 11 having a pass band from f0 to f1, which is from 100 Hz to 200 Hz in the first embodiment. As shown by the broken line in part (A) of FIG. 2, low frequency components S11 whose frequencies are from f0 to f1 are extracted from the audio signal S1 in the band-pass filter 11 and supplied through an attenuator 13 to the combining circuit 3.

Furthermore, the audio signal S1 is supplied through the input terminal 1 to a band-pass filter 21 having a pass band from f0/2 to f1/2, which is from 50 Hz to 100 Hz in the first embodiment. As shown in part (B) of FIG. 2, low frequency components S21 whose frequencies are from f0/2 to f1/2 are extracted from the audio signal S1 in the band-pass filter 21 and supplied to a pitch shifter 22.

The pitch shifter 22, which will be described in more detail below, multiplies the frequencies of the low frequency components S21 supplied thereto by two. Accordingly, as shown in part (C) of FIG. 2, second harmonic components S22 whose frequencies are from f0 to f1 are output from the pitch shifter 22 and supplied through an attenuator 23 to the combining circuit 3.

In addition, the audio signal S1 is supplied through the input terminal 1 to a band-pass filter 41 having a pass band from f0/4 to f1/4, which is from 25 Hz to 50 Hz in the first embodiment. As shown by the solid line in part (D) of FIG. 2, low frequency components S41 whose frequencies are from f0/4 to f1/4 are extracted from the audio signal S1 in the band-pass filter 41 and supplied to a pitch shifter 42.

The pitch shifter 42 multiplies the frequencies of the low frequency components S41 supplied thereto by four. Accordingly, as shown by the broken line in part (D) of FIG. 2, fourth harmonic components S42 whose frequencies are from f0 to f1 are output from the pitch shifter 42 and supplied through an attenuator 43 to the combining circuit 3.

Figure 2:
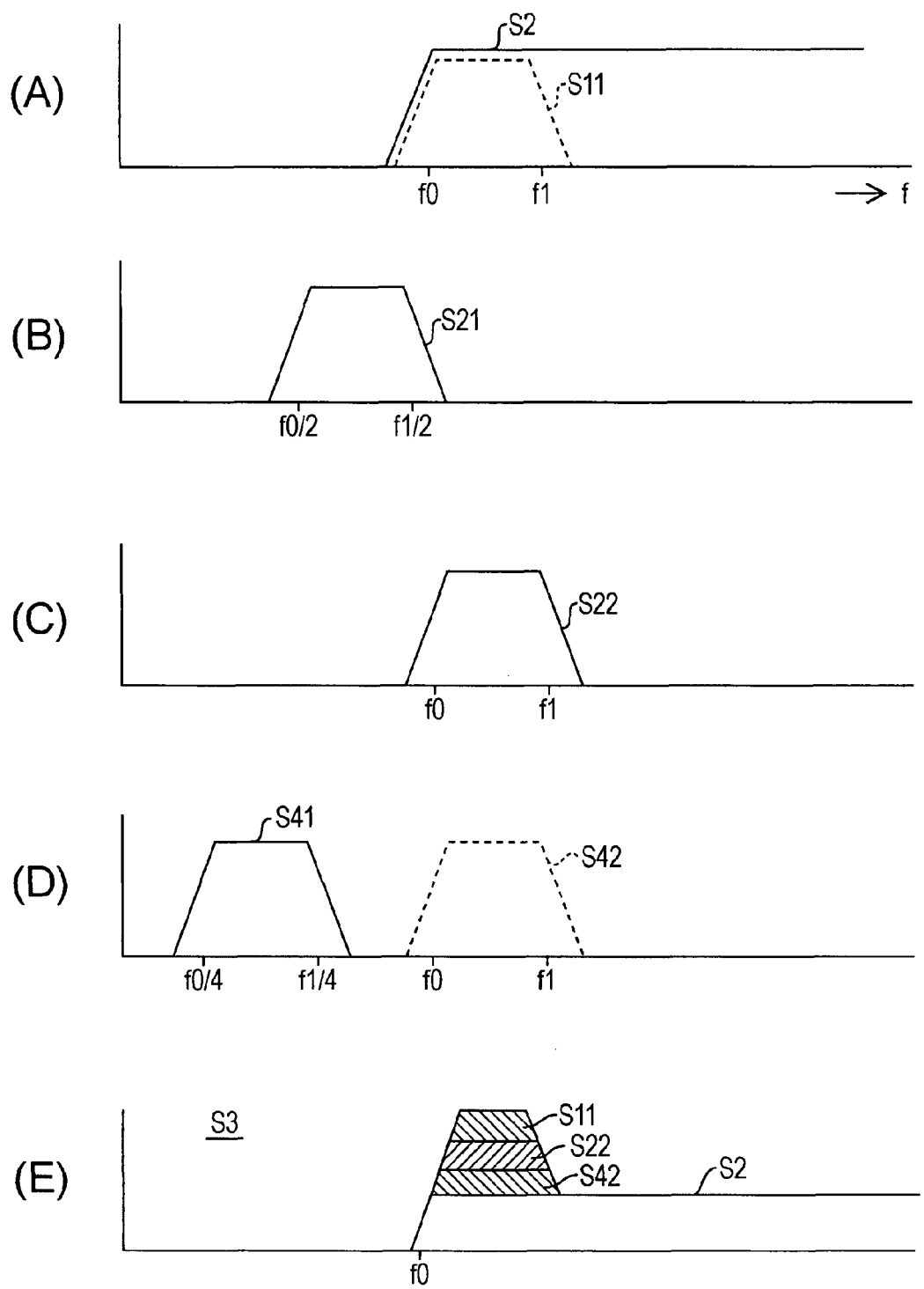
FIG. 2 includes diagrams each showing a frequency characteristic of the signal processing apparatus according to the first embodiment of the present invention.

As shown in part (E) of FIG. 2, an audio signal S3 is generated in the combining circuit 3 by combining the low frequency components S11, the second harmonic components S22, and the fourth harmonic components S42, which are supplied to the combining circuit 3 through the attenuators 13, 23, and 43, respectively, with the high and midrange frequency components S2 in a predetermined ratio. The audio signal S3 is supplied through a power amplifier 4 to the speaker 5.

In the above-described configuration, after the audio signal S1 is supplied to the input terminal 1, the frequencies of the low frequency components S21 and S41 are multiplied by two and four in the pitch shifters 22 and 42 to generate the second and fourth harmonic components S22 and S42, respectively. Then, the second and fourth harmonic components S22 and S42 are combined with the high and midrange frequency components S2. Thus, the audio signal S3 having a frequency characteristic shown in part (E) of FIG. 2 is generated from the audio signal S1 and supplied to the speaker 5.

Although the speaker 5 negligibly outputs the sound of the fundamental frequency components whose frequencies are lower than or equal to the resonance frequency f0, the speaker 5 outputs the sound of the second and fourth harmonic components S22 and S42. As described above, this allows the listener to perceive the sound as if the sound were output at the frequencies lower than or equal to the resonance frequency f0. As a result, the listener can experience the bass although the speaker 5 has a small diameter.

Figure 3:
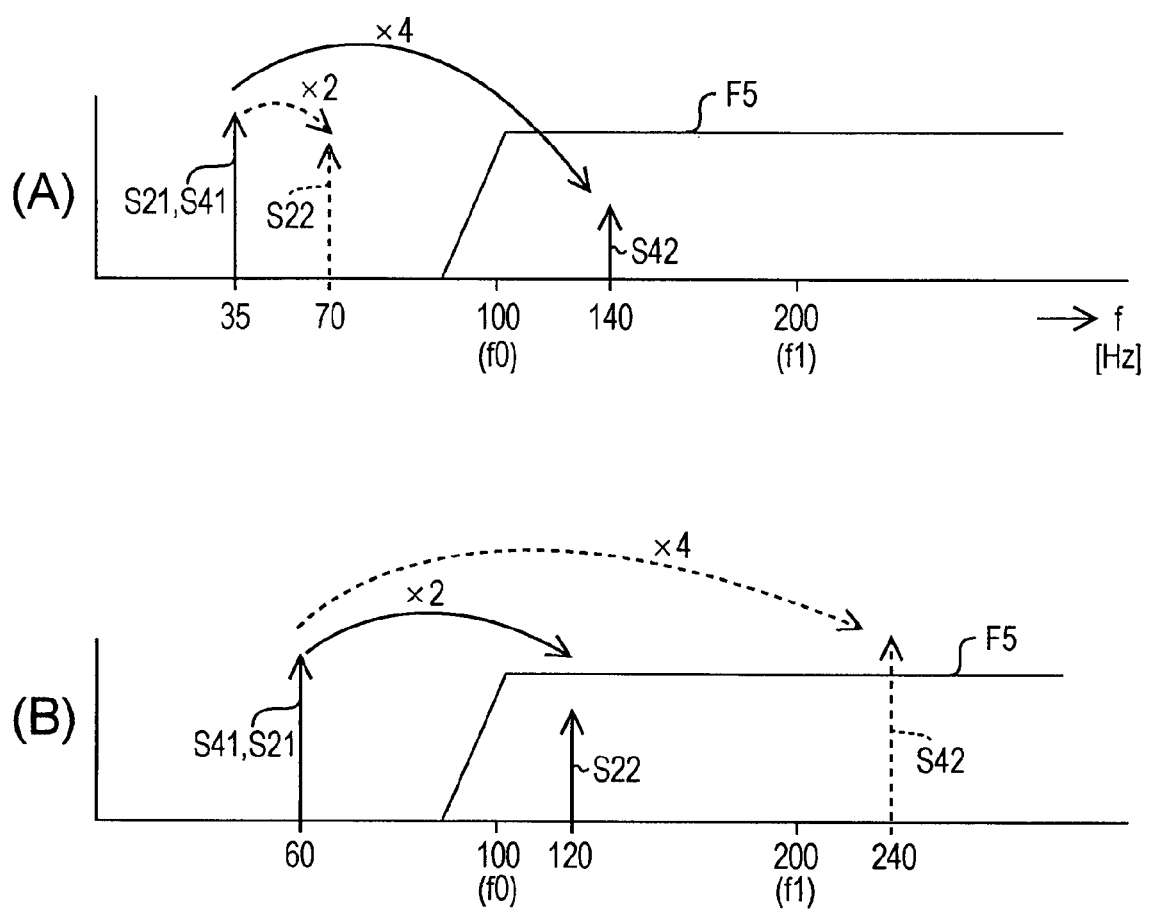
FIG. 3 includes diagrams each showing a frequency characteristic of the signal processing apparatus according to the first embodiment of the present invention.
Figure 13:
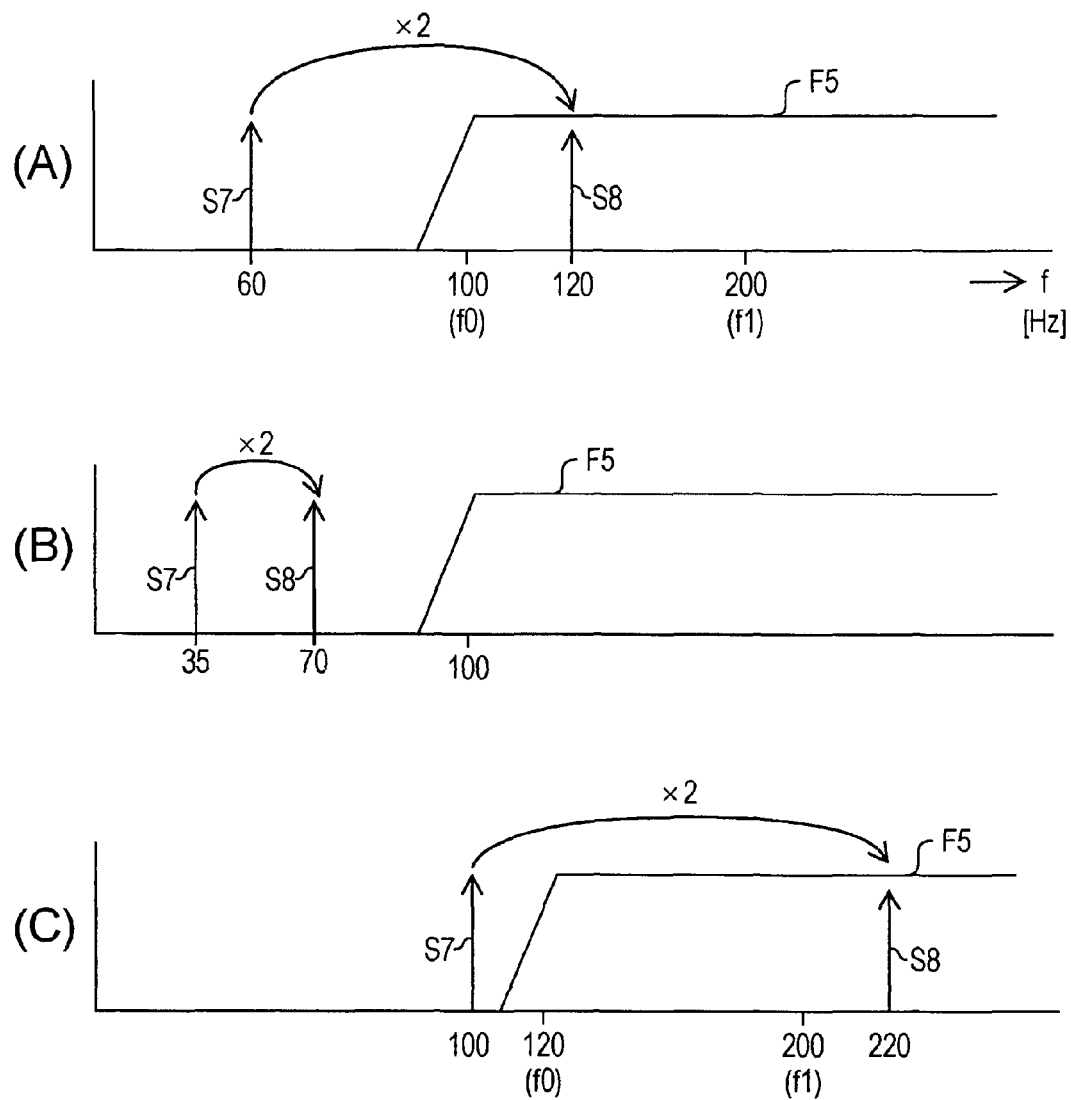
FIG. 13 includes diagrams each showing a frequency characteristic of the audio reproducing apparatus shown in FIG. 11.

In the above case, for example, as shown in part (A) of FIG. 3, in a case where the frequency of one of the low frequency components S21 (the frequency of one of the low frequency components S41) is 35 Hz, when a corresponding one of the second harmonic components S22 (shown by the broken line) is generated from the low frequency component S21, the frequency of the second harmonic component S22 is twice the frequency of the low frequency component S21, which is 70 Hz. It is difficult for the speaker 5 to reproduce the sound of the second harmonic component S22 at 70 Hz. The same case is shown in part (B) of FIG. 13.

However, in the signal processing apparatus shown in FIG. 1, in the case where the frequency of the low frequency component S21 is 35 Hz, the frequency of the low frequency component S21, i.e., the low frequency component S41, is supplied through the band-pass filter 41 to the pitch shifter 42, and the pitch shifter 42 generates a corresponding one of the fourth harmonic components S42. The frequency of the fourth harmonic component S42 (shown by the solid line) is four times that of the low frequency component S41, which is 140 Hz, and the fourth harmonic component S42 is supplied to the combining circuit 3. Accordingly, even when the frequency of the low frequency component S21 is 35 Hz, the listener can experience the bass corresponding to the low frequency component S21 by receiving the sound of the fourth harmonic component S42 whose frequency is four times that of the low frequency component S21.

Additionally, for example, as shown in part (B) of FIG. 3, in a case where the frequency of one of the low frequency components S41 (the frequency of one of the low frequency components S21) is 60 Hz, when a corresponding one of the fourth harmonic components S42 (shown by the broken line) is generated from the low frequency component S41, the frequency of the fourth harmonic component S42 is four times that of the low frequency component S41, which is 240 Hz, and exceeds an upper limit frequency f1 (≅200 Hz) used in combining harmonic components. Thus, when this fourth harmonic component S42 is supplied to the speaker 5, the listener feels that there is something wrong with the sound reproduced by the speaker 5. The same case is shown in part (C) of FIG. 13.

However, in the signal processing apparatus shown in FIG. 1, in the case where the frequency of the low frequency component S41 is 60 Hz, the low frequency component S41, i.e., the low frequency component S21, is supplied through the band-pass filter 21 to the pitch shifter 22, and the pitch shifter 22 generates a corresponding one of the second harmonic components S22. The frequency of the second harmonic component S22 (shown by the solid line) is twice that of the low frequency component S21, which is 120 Hz, and the second harmonic component S22 is supplied to the combining circuit 3. Accordingly, even when the frequency of the low frequency component S41 is 60 Hz, the listener can experience the bass corresponding to the low frequency component S41 by receiving the sound of the second harmonic component S22 whose frequency is twice that of the low frequency component S41.

In addition, as shown in parts (A) and (E) of FIG. 2, because the low frequency components S11 included in the original audio signal S1 are intensified, the listener can naturally perceive the bass.

Second Embodiment

Figure 4:
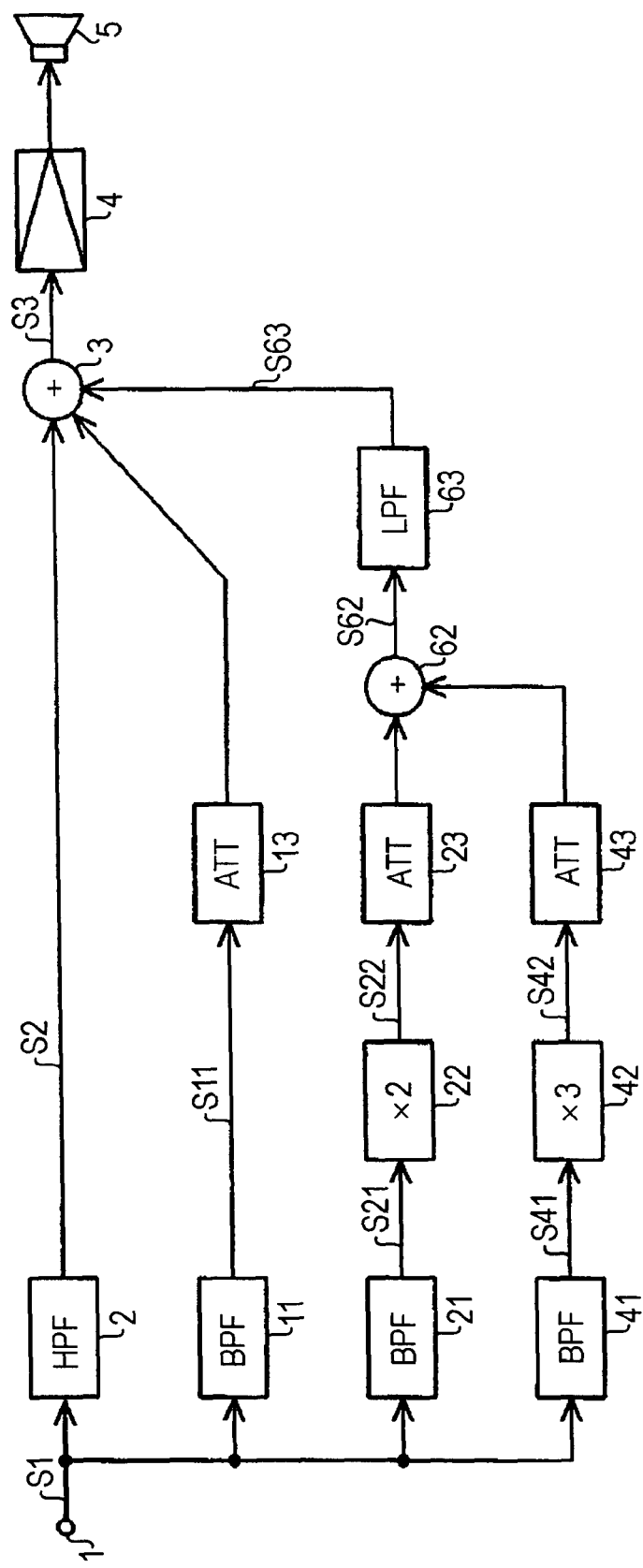
FIG. 4 is a flow diagram of a signal processing apparatus according to a second embodiment of the present invention.

FIG. 4 is a diagram of an exemplary configuration of a signal processing apparatus according to a second embodiment of the present invention. In the second embodiment, it is possible for the listener to effectively experience the bass even when f0>f1/2. As in the case of the signal processing apparatus shown in FIG. 1, the high and midrange frequency components S2 and the low frequency components S11 are extracted from the audio signal S1 and supplied to the combining circuit 3.

The input audio signal S1 is supplied to a band-pass filter 21. As shown by the broken line in part (A) of FIG. 5, the low frequency components S21 whose frequencies are from f0/2 to f1/2 are extracted from the audio signal S1 in the band-pass filter 21 and supplied to the pitch shifter 22. As shown by the sold line in part (A) of FIG. 5, the second harmonic components S22 whose frequencies are twice those of the low frequency components S21, i.e., the second harmonic components S22 whose frequencies are from f0 to f1, are output from the pitch shifter 22 and supplied through the attenuator 23 to a combining circuit 62.

Furthermore, the input audio signal S1 is supplied to a band-pass filter 41. As shown by the broken line in part (A) of FIG. 5, the low frequency components S41 whose frequencies are from f0/4 to f1/4 are extracted from the audio signal S1 in the band-pass filter 41 and supplied to the pitch shifter 42. As shown by the sold line in part (A) of FIG. 5, the fourth harmonic components S42 whose frequencies are four times those of the low frequency components S41, i.e., the fourth harmonic components S42 whose frequencies are from f0 to f1, are output from the pitch shifter 42 and supplied through the attenuator 43 to the combining circuit 62.

Figure 5:
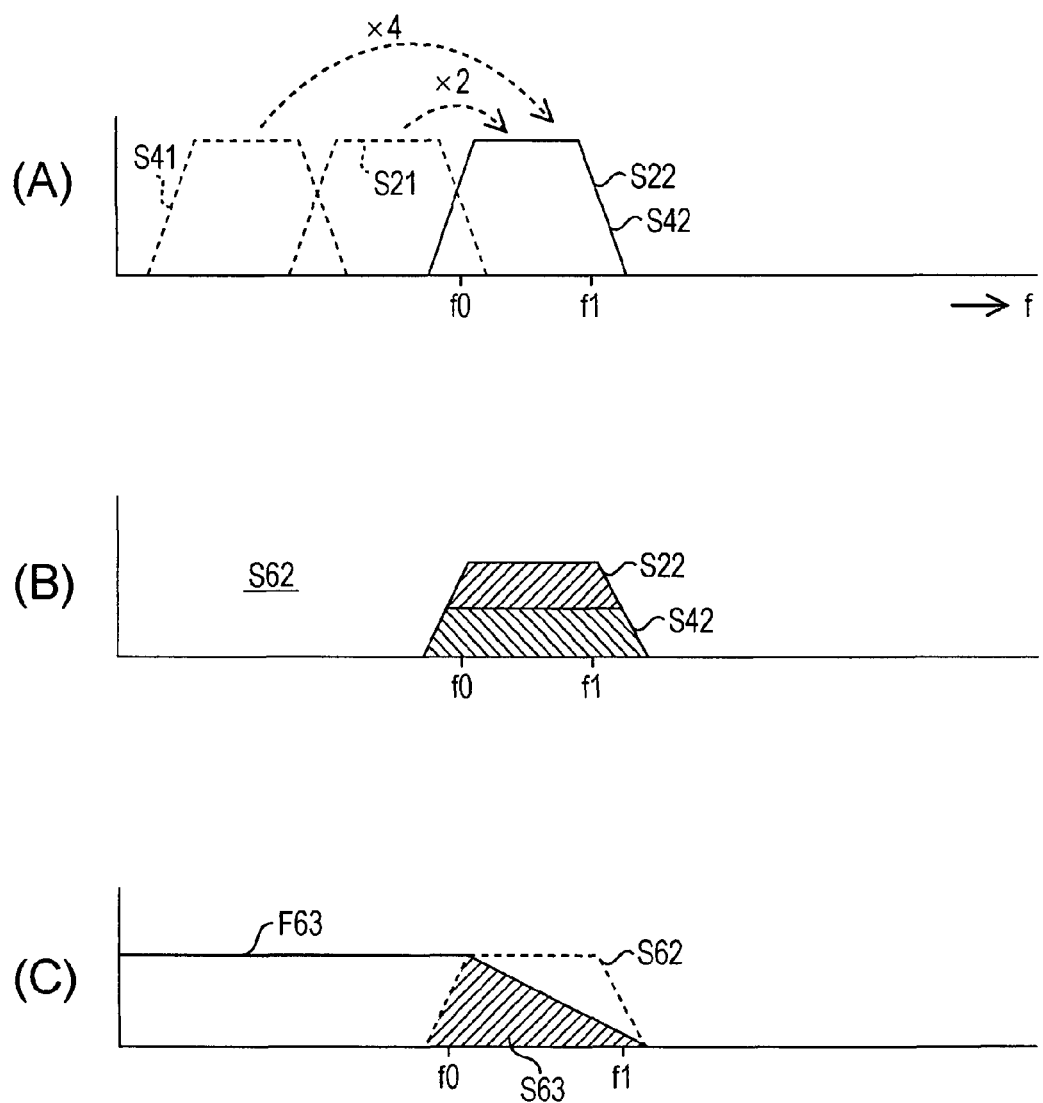
FIG. 5 includes diagrams each showing a frequency characteristic of the signal processing apparatus according to the second embodiment of the present invention.

As shown in part (B) of FIG. 5, a combined signal S62 is generated in the combining circuit 62 by combining the second harmonic components S22 and the fourth harmonic components S42 and supplied to a low-pass filter 63. The low-pass filter 63 has a frequency characteristic, for example, shown by the curve F63 in part (C) of FIG. 5. More specifically, the frequency characteristic is that the resonance frequency f0 is used as the cut-off frequency and input signal components are substantially removed at the upper limit frequency f1.

Accordingly, harmonic components S63 (hatched portion) including the second and fourth harmonic components whose sound does not make the listener feel that there is something wrong with the sound are extracted from the combined signal S62 in the low-pass filter 63 and supplied to the combining circuit 3. The audio signal S3 is output from the combining circuit 3 and supplied though the power amplifier 4 to the speaker 5.

In the above-described configuration, as in the case of the signal processing apparatus shown in FIG. 1, the pitch shifters 22 and 42 generate the second harmonic components S22 whose frequencies are twice those of the low frequency components S21 and the fourth harmonic components S42 whose frequencies are four times those of the low frequency components S41. Then, the second and fourth harmonic components S22 and S42 are combined with the high and midrange frequency components S2. As described above, this allows the listener to perceive the sound as if the sound were output from the speaker 5 at the frequencies lower than or equal to the resonance frequency f0. As a result, the listener can experience the bass although the speaker 5 has a small diameter.

Furthermore, although, in the combining circuit 3, the harmonic components S63, which includes the second and fourth harmonic components, are combined with the high and midrange frequency components S2, the levels of the harmonic components S63 are reduced in the low-pass filter 63 as the frequencies of the harmonic components S63 approach the upper limit frequency f1. This can reduce the listener's feeling that there is something wrong with the sound even when the harmonic components S63 include a frequency component whose frequency exceeds the upper limit frequency f1. As a result, even when f0>f1/2, the sound does not make the listener feel that there is something wrong with the sound, so that the listener can experience the bass.

Third Embodiment

Figure 6:
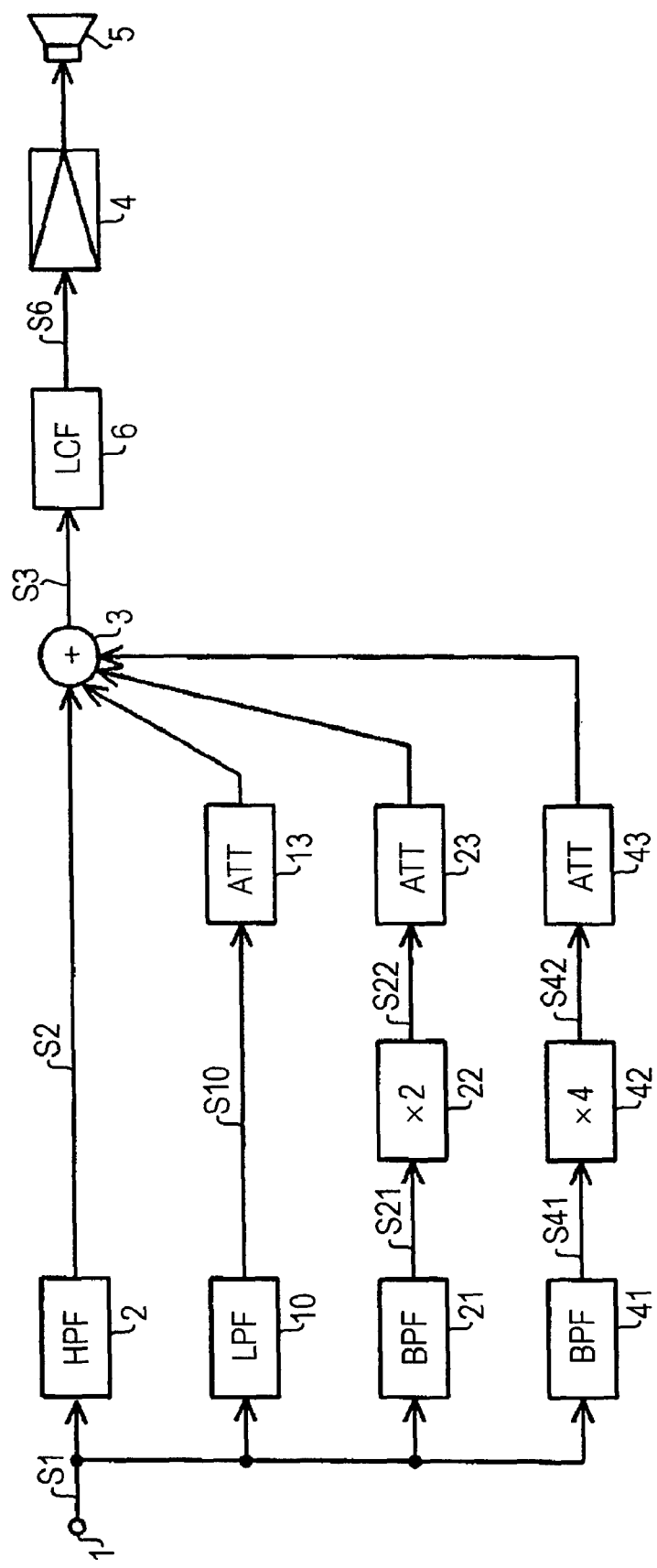
FIG. 6 is a flow diagram of a signal processing apparatus according to a third embodiment of the present invention.

FIG. 6 is a diagram of an exemplary configuration of a signal processing apparatus according to a third embodiment of the present invention. As in the case of the signal processing apparatus shown in FIG. 1, the audio signal S1 is supplied through the input terminal 1 to the high-pass filter 2. The high and midrange frequency components S2 whose frequencies are higher than or equal to the resonance frequency f0 of the speaker 5 are extracted from the audio signal S1 in the high-pass filter 2 and supplied to the combining circuit 3. Additionally, the audio signal S1 input from the input terminal 1 is supplied to a low-pass filter 10 having a pass band which is lower than or equal to the upper limit frequency f1 that is 200 Hz in the third embodiment. Low frequency components S10 whose frequencies are lower than or equal to the upper limit frequency f1 are extracted from the audio signal S1 in the low-pass filter 10. The low frequency components S10 are supplied through the attenuator 13 to the combining circuit 3 and combined with the high and midrange frequency components S2 in a predetermined ratio.

Furthermore, as in the case of the signal processing apparatus shown in FIG. 1, the second and fourth harmonic components S22 and S42 are generated by using the band-pass filters 21 and 41 and the pitch shifters 22 and 42, supplied to the combining circuit 3 through the attenuators 23 and 43, respectively, and combined with the high and midrange frequency components S2 in a predetermined ratio.

As shown in part (A) of FIG. 7, the audio signal S3 is generated in the combining circuit 3 by combining the low frequency components S10, the second harmonic components S22, and the fourth harmonic components S42, which are supplied to the combining circuit 3 through the attenuators 13, 23, and 43, respectively, with the high and midrange frequency components S2 in a predetermined ratio.

The audio signal S3 is supplied to a low-frequency cut filter 6. As shown in part (B) of FIG. 7, an audio signal S6 is generated in the low-frequency cut filter 6 by removing deep low frequency components having a negative effect on the speaker 5 with a small diameter from the audio signal S3; when the deep low frequency components are supplied to the speaker 5, the normal bass is not output but components (harmonic components) that cause sound distortion are output in high volume from the speaker 5. The audio signal S6 is supplied through the power amplifier 4 to the speaker 5.

In the above-described configuration, although the speaker 5 negligibly outputs the sound of the low frequency components S10, the speaker 5 outputs the sound of the second and fourth harmonic components S22 and S42 of the low frequency components S10. As described above, this allows the listener to perceive the sound as if the sound of the low frequency components S10 were output. As a result, the listener can experience the bass although the speaker 5 has a small diameter.

Furthermore, as shown in part (B) of FIG. 7, because some of the low frequency components S10 remain in the audio signal S6, the listener can naturally experience the bass. In addition, the deep low frequency components having a negative effect on the speaker 5 with a small diameter are removed from the low frequency components S11 in the low-frequency cut filter 6. Thus, a case where components (harmonic components) that cause sound distortion are output in high volume, although the normal bass is negligibly output from the speaker 5, does not occur.

Examples of Pitch Shifters 22 and 42

Figure 8:
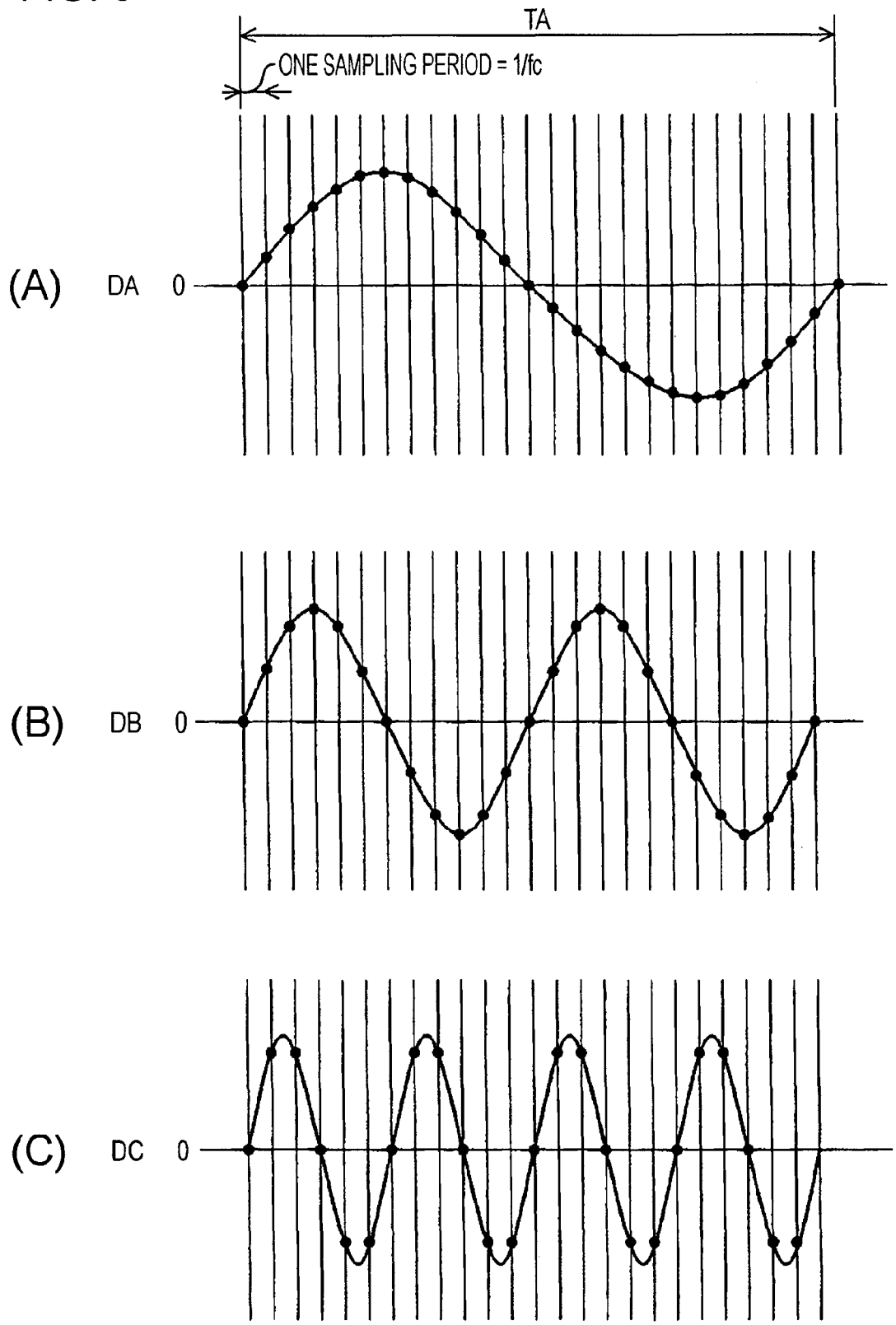
FIG. 8 illustrates waveforms describing signal processing according to the embodiments of the present invention.

The second harmonic components S22 whose frequencies are twice the frequencies of the low frequency components S21 and the fourth harmonic components S42 whose frequencies are four times the frequencies of the low frequency components S41 can be generated by a method illustrated in FIG. 8. Suppose that digital data DA that can be digital to analog (D/A) converted into data representing one cycle of a sinusoidal signal SA as shown in part (A) of FIG. 8 is stored in a memory. A symbol • indicates a sampling point of the digital data DA. A period TA is one period of the sinusoidal signal SA, and a period 1/fc is one sampling period.

When the digital data DA is read from the memory, by reading the digital data DA on a sample by sample basis at a clock frequency fc which is the same frequency as used in writing, data representing one period of the sinusoidal signal SA can be obtained in the period TA.

Similarly, when the digital data DA is read from the memory, as shown in part (B) of FIG. 8, by reading the digital data DA from every other address of the memory at a clock frequency fc which is the same frequency as used in the writing and performing the reading twice, data representing two periods of a sinusoidal signal SB whose frequency is twice that of the sinusoidal signal SA can be obtained in the period TA. That is, the second harmonic component SB having a frequency twice that of the sinusoidal signal SA can be obtained in the period TA.

Moreover, when the digital data DA is read from the memory, as shown in part (C) of FIG. 8, by reading the digital data DA from every four addresses of the memory at a clock frequency fc which is the same frequency as used in the writing and performing the reading four times, data representing four periods of a sinusoidal signal SC whose frequency is four times that of the sinusoidal signal SA can be obtained in the period TA. That is, the fourth harmonic component SC having a frequency four times that of the sinusoidal signal SA can be obtained in the period TA.

Figure 9:
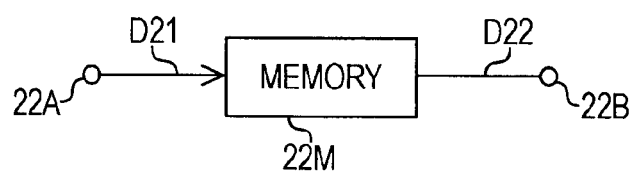
FIG. 9 is a flow diagram of a circuit according the embodiments of the present invention.

The pitch shifters 22 and 42 may have, for example, the configuration shown in FIG. 9. Referring to FIG. 9, a memory 22M, for example, including a ring buffer, has a substantially sufficient number of addresses (substantially sufficient capacity). It is assumed that the low frequency components S21 are described by a waveform shown in part (A) of FIG. 10, digital data D21 is obtained by performing analog to digital (A/D) conversion of the data described by the waveform, and the sampling frequency (clock frequency) for the A/D conversion is fc.

A point at which the sign of the digital data D21 (the low frequency components S21) changes, for example, from negative to positive, is defined as a point tx. A period between a certain point tx and the next point tx, i.e., one period of the low frequency components S21, is defined as a period Tx.

Referring to FIG. 9, the digital data D21 is supplied through an input terminal 22A to the memory 22M. As shown in part (A) of FIG. 10, the digital data D21 is written on a sample by sample basis in respective addresses of the memory 22M. Accordingly, the period Tx shown in FIG. 10 corresponds to the period TA shown in FIG. 8, and part (A) of FIG. 10 corresponds to part (A) of FIG. 8.

The digital data D21 is simultaneously written to and read from the memory 22M. For the sake of simplicity, referring to FIG. 10, the period Tx is used as a writing cycle and a reading cycle, and the writing and reading are simultaneously performed in the period Tx.

As in a manner similar to that shown in part (B) of FIG. 8, the digital data D21 written in the memory 22M is read from every other address of the memory 22M at a clock frequency fc which is the same frequency as used in the writing, and the reading is performed twice in the period Tx, whereby digital data D22 is obtained. By performing D/A conversion of this digital data D22 read from the memory 22M, the second harmonic components S22 whose frequencies are twice those of the original low frequency components S21 can be obtained.

Similarly, the low frequency components S41 are A/D converted to generate digital data, and this digital data is written in the memory 22M. The written digital data is read in a manner similar to that shown in part (C) of FIG. 8. That is, the digital data is read from every four addresses of the memory 22M at a clock frequency fc which is the same frequency as used in the writing, and the reading is performed four times in the period Tx. By performing D/A conversion of the digital data read from the memory 22M, the fourth harmonic components S42 whose frequencies are four times those of the original low frequency components S41 can be obtained.

CONCLUSION

In the above-described signal processing apparatuses, even when the frequencies of the low frequency components are lower than the resonance frequency f0 of the speaker 5, the second harmonic components S22 and the fourth harmonic components S42 whose frequencies are higher than the resonance frequency f0 of the speaker 5 are generated in the pitch shifters 22 and 42, respectively, combined with the high and midrange frequency components S2, and supplied to the speaker 5. Thus, the listener can experience the bass although the speaker 5 has a small diameter.

Additionally, in order to generate the harmonic components, the frequencies of the low frequency components are multiplied by two or four such that the frequencies of the harmonic components can fall within the band between the resonance frequency f0 of the speaker 5 and the upper limit frequency f1. This prevents the listener from feeling that there is something wrong with the bass.

Furthermore, as shown in part (B) of FIG. 7, since some of the original low frequency components S10 remain in the audio signal S6, the listener can naturally experience the bass. In addition, the deep low frequency components having a negative effect on the speaker 5 with a small diameter are removed from the low frequency components S10 in the low-frequency cut filter 6. Thus, the case where the components that cause sound distortion are output in high volume, although the normal bass is not output from the speaker 5, does not occur.

For example, because the relationship between third harmonic components and the fundamental frequency components is not an octave, the sound of the third frequency components makes the listener feel that there is something wrong with the sound. In contrast, the second or fourth harmonic components have frequencies higher by an octave or two octaves than those of the fundamental frequencies. Thus, the sound of the second or fourth frequency components does not make the listener feel that there is something wrong with the sound.

Other Embodiments

In the above descriptions, the signal system in which the output audio signal S6 is generated from the input audio signal S1 is realized by digital signal processing using a digital signal processor (DSP) or dedicated hardware. For example, the band-pass filter 21 and the pitch shifter 22 may share a memory, or the band-pass filter 21 and the band-pass filter 41 may share a memory. For example, when the band-pass filter 21 processes digital data representing one cycle and supplies the result of the processing to the pitch shifter 22, the band-pass filter 21 and the pitch shifter 22 may share a buffer memory.

Figure 10:
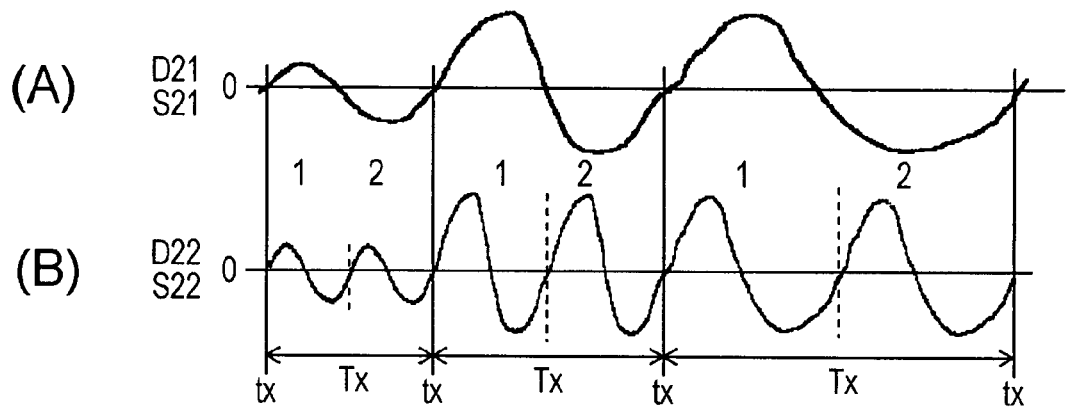
FIG. 10 illustrates waveforms describing signal processing performed in the circuit shown in FIG. 9.
Figure 11:
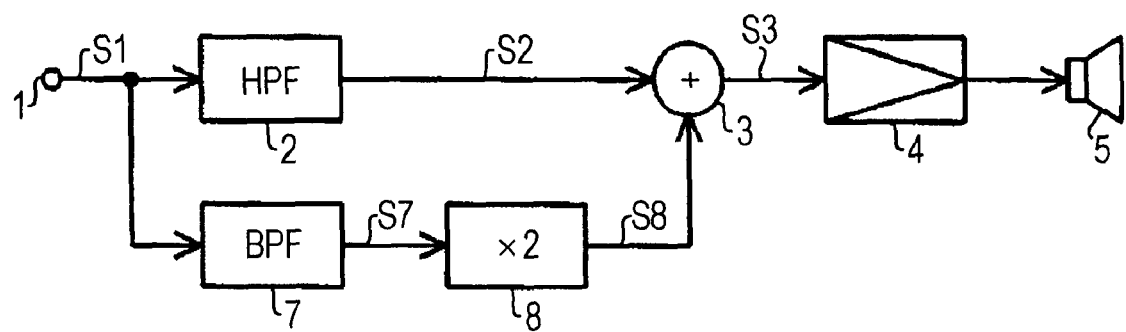
FIG. 11 is a flow diagram of an exemplary audio reproducing apparatus of the related art.
Figure 12:
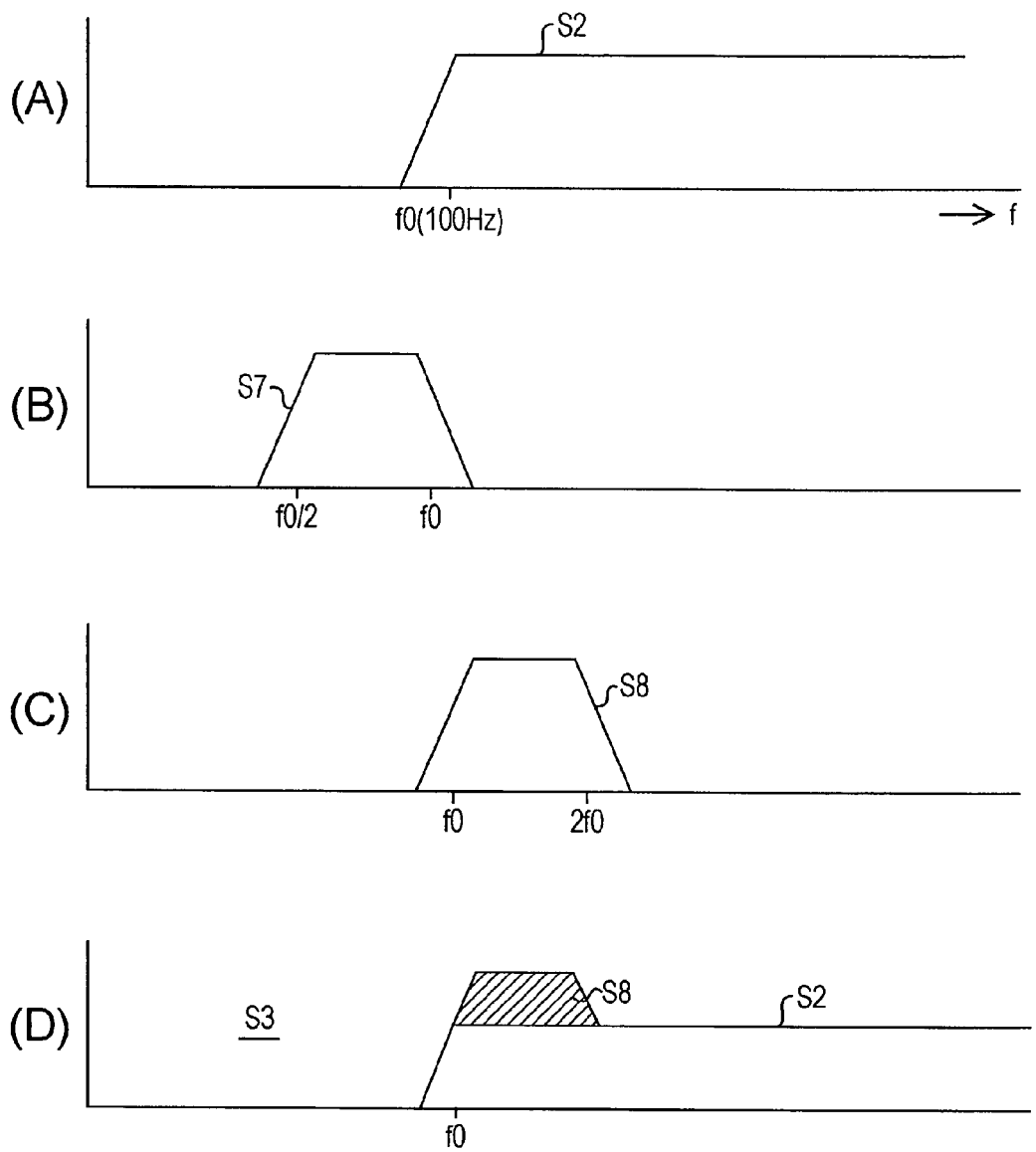
FIG. 12 includes diagrams each showing a frequency characteristic of the audio reproducing apparatus shown in FIG. 11.

Additionally, in the foregoing descriptions, as shown in FIG. 10, the pitch shifter 22 performs multiplication by two in units of cycles of the input digital data D21 (the low frequency components S21). Similarly, the pitch shifter 22 may perform multiplication by two in units of certain periods. This allows processing of data represented by a waveform such that the end of a waveform in a certain period can be continuously connected to the beginning of a waveform in the next period.

Furthermore, low frequency components having considerably low frequencies may be recorded in, for example, a compact disc (CD) or a super audio CD (SACD). In order that the listener can experience the bass of the low frequency components, not only second and fourth harmonic components but also eighth, sixteenth, and thirty-second harmonic components and the like may be combined with an original audio signal. More specifically, the harmonic components whose frequencies do not exceed the upper limit frequency f1 and are N (N=2n where n=an integer from 1 to 6) times the frequency of the frequency component of bass that the listener wants to experience may be combined with the original audio signal.

It should be understood by those skilled in the art that various modifications, combinations, sub-combinations and alterations may occur depending on design requirements and other factors insofar as they are within the scope of the appended claims or the equivalents thereof.

What is claimed is:

1. A signal processing apparatus comprising:
a first extracting unit configured to extract from an input audio signal a first frequency component having a first frequency band;
a second extracting unit configured to extract from the input audio signal a second frequency component having a second frequency band;
a first-harmonic-component generating unit configured to generate a first-harmonic-component signal including a third frequency component whose frequency is N1 times that of the first frequency component extracted in the first extracting unit;
a second-harmonic-component generating unit configured to generate a second-harmonic-component signal including a fourth frequency component whose frequency is N2 times that of the second frequency component extracted in the second extracting unit; and
a combining unit configured to combine the input audio signal, the first-harmonic-component signal, and the second-harmonic-component signal in a first predetermined ratio,
wherein the first frequency band is higher than the second frequency band, and
wherein N1 and N2 are positive integers, and N1 is smaller than N2.

2. The signal processing apparatus according to claim 1, further comprising a third extracting unit configured to extract from the input audio signal a fifth frequency component having a third frequency band,
wherein the combining unit combines the input audio signal, the first-harmonic-component signal, the second-harmonic-component signal, and a signal including the fifth frequency component extracted in the third extracting unit in a second predetermined ratio.

3. The signal processing apparatus according to claim 1, wherein the combining unit combines the first-harmonic-component signal and the second-harmonic-component signal in a third predetermined ratio to generate a combined signal, supplies the combined signal to a low-pass filter, and combines an output of the low-pass filter and the input audio signal.

4. The signal processing apparatus according to claim 1, further comprising a high-pass filter configured to extract from the input audio signal a sixth frequency component having a fourth frequency band higher than the first frequency band,
wherein the combining unit combines a signal including the sixth frequency component extracted in the high-pass filter, the first-harmonic-component signal, and the second-harmonic-component signal in a fourth predetermined ratio.

5. The signal processing apparatus according to claim 1, further comprising a low-frequency cut filter configured to remove a low frequency component from an output signal of the combining unit.

6. The signal processing apparatus according to claim 1, wherein a fifth frequency band is obtained by multiplying frequencies of the first frequency band by N1 and a sixth frequency band is obtained by multiplying frequencies of the second frequency band by N2, and wherein the fifth frequency band and the sixth frequency band are substantially equal.

7. The signal processing apparatus according to claim 1, wherein N1 and N2 are positive integers and powers of two.

8. A signal processing apparatus comprising:
first extracting means for extracting from an input audio signal a first frequency component having a first frequency band;
second extracting means for extracting from the input audio signal a second frequency component having a second frequency band;
first-harmonic-component generating means for generating a first-harmonic-component signal including a third frequency component whose frequency is N1 times that of the first frequency component extracted in the first extracting means;
second-harmonic-component generating means for generating a second-harmonic-component signal including a fourth frequency component whose frequency is N2 times that of the second frequency component extracted in the second extracting means; and
combining means for combining the input audio signal, the first-harmonic-component signal, and the second-harmonic-component signal in a predetermined ratio,
wherein the first frequency band is higher than the second frequency band, and
wherein N1 and N2 are positive integers, and N1 is smaller than N2.

* * * * *